(12) United States Patent
Isobe

(10) Patent No.: US 7,145,638 B2
(45) Date of Patent: Dec. 5, 2006

(54) ALIGNMENT APPARATUS, EXPOSURE APPARATUS, AND DEVICE MANUFACTURING METHOD

(75) Inventor: Hiroshi Isobe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 172 days.

(21) Appl. No.: 10/941,922

(22) Filed: Sep. 16, 2004

(65) Prior Publication Data

US 2005/0078290 A1    Apr. 14, 2005

(30) Foreign Application Priority Data

Sep. 22, 2003    (JP)    ............................. 2003-330402

(51) Int. Cl.
G03B 27/52    (2006.01)
G03B 27/58    (2006.01)
G03B 27/62    (2006.01)

(52) U.S. Cl. ............................. 355/55; 355/72; 355/75

(58) Field of Classification Search .................. 355/53, 355/55, 72–77; 250/548; 356/399–401, 356/500; 318/569, 575

See application file for complete search history.

(56) References Cited

U.S. PATENT DOCUMENTS

| | | | | |
|---|---|---|---|---|
| 5,877,845 | A | * | 3/1999 | Makinouchi .................. 355/53 |
| 6,285,444 | B1 | * | 9/2001 | Osanai et al. .................. 355/72 |
| 6,495,847 | B1 | * | 12/2002 | Asano et al. ............... 250/548 |
| 2003/0234939 | A1 | * | 12/2003 | Kurosawa ................... 356/500 |

FOREIGN PATENT DOCUMENTS

JP    6-165552    6/1994

* cited by examiner

*Primary Examiner*—Henry Hung Nguyen
(74) *Attorney, Agent, or Firm*—Fitzpatrick, Cella, Harper & Scinto

(57) ABSTRACT

A position measurement unit measures the position of an object to be position controlled. A microprocessor performs a plurality of types of operations on the basis of the obtained position signal and outputs the operation result as a control signal that pertains to position control of the object to be position controlled. The microprocessor performs a difference operation, which calculates the difference signal of the position signal at the first sampling frequency and performs operations other than difference operation at the second sampling frequency lower than the first sampling frequency.

8 Claims, 14 Drawing Sheets

FIG. 12
10-kHz SAMPLING (SOLID LINE) AND 40-MHz SAMPLING (DOTTED LINE)
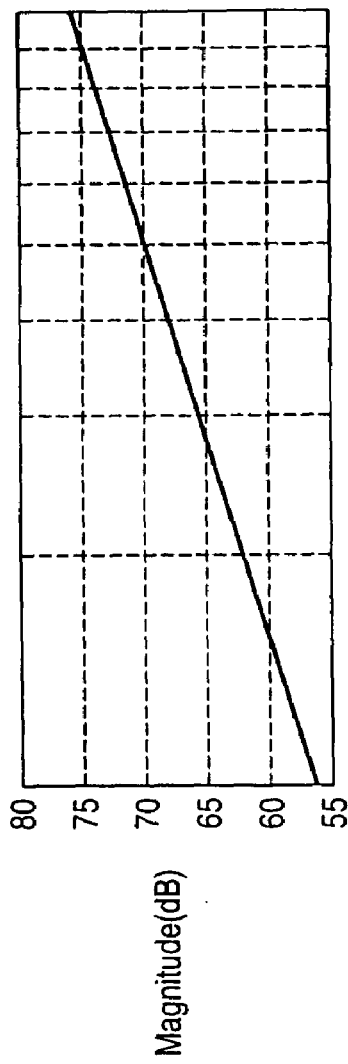
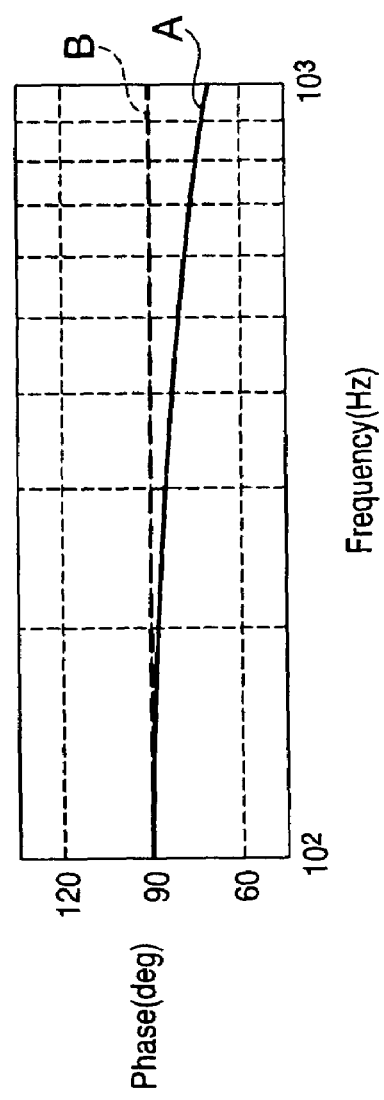

FIG. 13
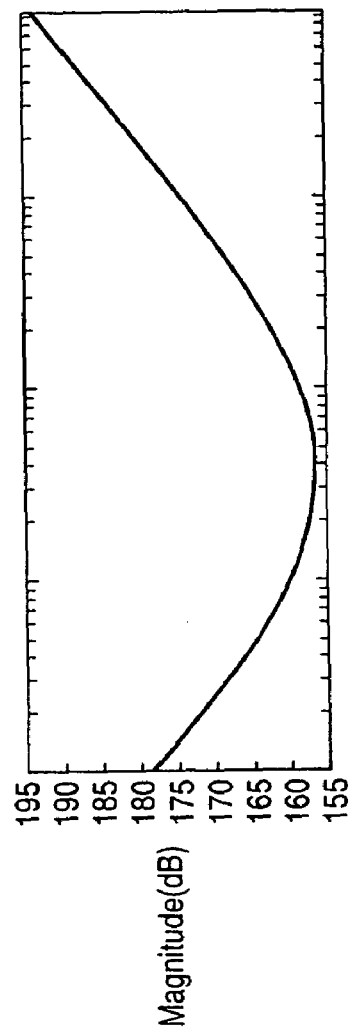
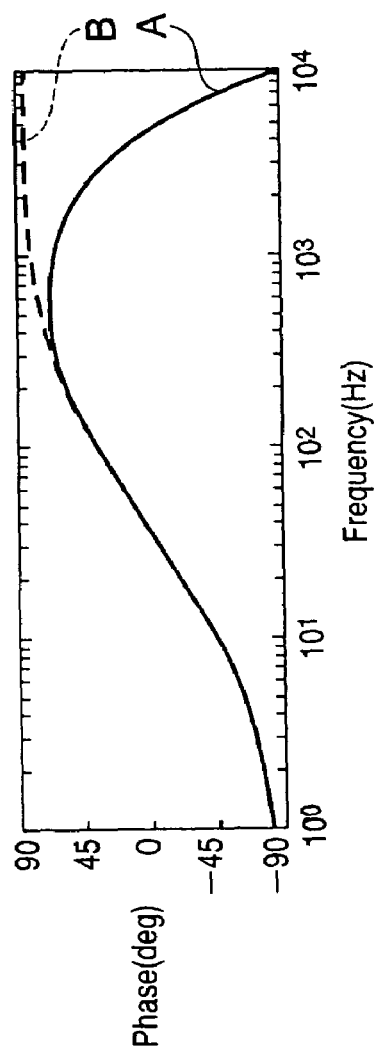
10-kHz SAMPLING (SOLID LINE) AND 40-MHz SAMPLING (DOTTED LINE)

ALIGNMENT APPARATUS, EXPOSURE APPARATUS, AND DEVICE MANUFACTURING METHOD

CLAIM OF PRIORITY

This application claims priority from Japanese Patent Application No. 2003 330402 filed on Sep. 22, 2003, the entire contents of which are hereby incorporated by reference herein.

FIELD OF THE INVENTION

The present invention relates to an alignment apparatus comprising a measuring instrument, which measures the position of an object to be position controlled and a processor, which performs a plurality of types of operations on the basis of a position signal obtained by the measuring instrument and outputs the operation result as a control signal that pertains to position control of the object to be position controlled, an exposure apparatus having the alignment apparatus, and a device manufacturing method of manufacturing a semiconductor device using the exposure apparatus.

BACKGROUND OF THE INVENTION

As a conventional technique, stage control of a stage which moves a wafer or reticle in a semiconductor exposure apparatus (to be referred to in abbreviated form as an exposure apparatus hereinafter) will be exemplified.

Performance characteristics required for the stage of a semiconductor exposure apparatus are:
1. quick response (responsiveness);
2. stability; and
3. good control accuracy (steady state error).

In stage control, PID compensation is used to improve these performance characteristics. Along with a recent decrease in exposure line width, an exposure apparatus stage is required to have position control accuracy on the order of several nanometers. For the purpose of increasing the productivity, the stage moving acceleration and velocity are increasing year by year.

To realize high speed, high precision position control, a wafer stage position control system needs to have a high servo band. For this reason, analog control using an analog device such as an operational amplifier is being replaced by digital control using a microprocessor which performs high speed digital signal processing typified by DSP. Many exposure apparatuses adopt this method.

An example of a control system of an exposure apparatus which performs conventional digital control using a microprocessor will be described with reference to FIG. 11.

FIG. 11 is a diagram for explaining the control system of a conventional exposure apparatus.

For the sake of descriptive simplicity, the controller of a single stage will be described here. The basic arrangement of the control system of each of various stages (e.g., a wafer stage, reticle stage, and the like) in the exposure apparatus is not different from that of this example.

Reference numeral 11 denotes a stage to be position controlled in the exposure apparatus. A position measurement unit 13 measures a position signal y(t) of the stage 11. The position signal y(t) is converted by an A/D converter 19 to a digital signal y(n).

Reference symbol t denotes time; and n, the sample number. That is, the position signal y(t) is a position signal at time t. The digital signal y(n) is a digital signal whose sample number is n.

A control command value (control signal) u(n) is calculated within a microprocessor 18. The control signal u(n) is converted by a D/A converter 15 to a continuous time signal u(t) and is amplified by a current amplifier 12 to a signal i(t). With the signal, a linear motor 11a drives the stage 11.

The position of the stage 11 thus controlled is measured again by the position measurement unit 13. A similar control operation is repeated, and the stage 11 reaches a position target value.

In the microprocessor 18, the following calculation processes are performed.

1. An adder 903 calculates an error signal $e_p(n)$, which is a difference between the digital signal y(n) and a position target value $r_p(n)$ generated by a position target value generator 17a.
2. A difference operation unit 16b calculates an error difference signal $e_d(n)$ of the error signals $e_p(n)$.
3. A sum operation unit 16a calculates an error sum signal $e_i(n)$ of the error signals $e_p(n)$.
4. The product of the error signal $e_p(n)$ and a proportional gain 14a, the product of the error sum signal $e_i(n)$ and an integral gain 14b, and the product of the error difference signal $e_d(n)$ and a derivative gain 14c, are calculated. An adder 902 calculates the sum of the products as the control signal u(n). These calculation processes are performed for every predetermined sampling period.

Note that the error difference signal $e_d(n)$ specifically means an error signal difference obtained by the immediately preceding sampling, i.e., $e_d(n)=e_p(n)-e_p(n-1)$.

As described above, the microprocessor 18, which calculates the control signal u(n), conventionally operates at a single sampling frequency.

One of the factors which lowers the control band in an alignment apparatus having a digital alignment compensator is a delay time which may appear in an error difference signal due to a difference operation of error signals. As the delay time becomes longer, the control band becomes lower, and the alignment precision decreases.

A delay time caused by a difference operation depends on the sampling frequency at which a difference operation is performed. The delay time becomes longer with a decrease in sampling frequency.

The frequency characteristic of a difference operation will be described with reference to FIG. 12.

FIG. 12 shows graphs of the frequency characteristics of a difference operation at sampling frequencies of 10 kHz and 40 MHz.

The upper half of FIG. 12 is a level graph showing the relationship between the sampling frequency and its frequency level while the lower half is a phase graph showing the relationship between the sampling frequency and the phase.

In the lower phase graph, a solid line A indicates a case of the sampling frequency of 10 kHz while a dotted line B indicates a case of the sampling frequency of 40 MHz.

In an ideal difference operation in which the sampling frequency is infinite, the phase remains 90° even if the frequency infinitely increases. However, as seen from the phase graph, a delay increases with a decrease in sampling frequency. The delay at the sampling frequency of 10 kHz is larger than that at the sampling frequency of 40 MHz. The phase is delayed more at the sampling frequency of 10 kHz.

A PID compensator outputs the sum of an error signal, error sum signal, and error difference signal as a control signal. If the error difference signal suffers a delay, the control signal output from the PID compensator suffers a delay.

The frequency characteristic of the PID compensator will be described with reference to FIG. 13.

FIG. 13 shows graphs of the frequency characteristics of the PID compensator at the sampling frequencies of 10 kHz and 40 MHz.

The upper half of FIG. 13 is a level graph showing the relationship between the sampling frequency and its frequency level while the lower half is a phase graph showing the relationship between the sampling frequency and the phase.

In the lower phase graph, a solid line A indicates a case of the sampling frequency of 10 kHz, and a dotted line B indicates a case of the sampling frequency of 40 MHz. According to the phase graph, a signal output from the PID compensator is delayed more at the sampling frequency of 10 kHz. This delay decreases a phase margin.

The open-loop transfer characteristics when a digital alignment compensator controls, at the sampling frequencies of 10 kHz and 40 MHz, an object to be controlled two-dimensionally, i.e., in the X and Y directions (or three-dimensionally, i.e., in the X, Y, and Z directions), such as an exposure apparatus stage, will be described with reference to FIG. 14.

FIG. 14 shows graphs of the frequency characteristics of the open loop transfer function in the alignment compensator at the sampling frequencies of 10 kHz and 40 MHz.

The upper half of FIG. 14 is a level graph showing the relationship between the sampling frequency and its gain level while the lower half is a phase graph showing the relationship between the sampling frequency and the phase.

In the lower phase graph, a solid line A indicates a case of the sampling frequency of 10 kHz, and a dotted line B indicates a case of the sampling frequency of 40 MHz.

As for the alignment compensator phases at sampling frequencies whose gains are below 0 [dB] (zero-crossing frequency), there is hardly any phase margin at the sampling frequency of 10 kHz, while there is a sufficient phase margin at the sampling frequency of 40 MHz. When this phase margin decreases, the control system becomes unstable, and the alignment precision decreases. To increase the control performance, the sampling frequency must be increased as much as possible.

Under the circumstances, in, e.g., a phase compensator for a servo circuit disclosed in Japanese Patent Laid-Open No. 06-165552, only a difference operation is performed by an analog differentiating circuit, thereby suppressing any delay time. The derivative compensation with this arrangement feeds back not the derivative value of a position error signal, but the derivative value of a position signal and does not compensate for any PID for an error in the position signal. In this arrangement, an analog circuit is used for a differential operation. A differential signal thus obtained may contain a noise component, which may decrease the alignment precision.

As described above, in a conventional technique, a microprocessor which calculates control signals operates at a single sampling frequency. For this reason, to increase the sampling frequency, a microprocessor with higher processing power is necessary.

However, a microprocessor with high processing power is expensive, and the product cost increases.

Additionally, only a difference operation needs to be performed at a high sampling frequency, and the sampling frequencies for other processes need not be high.

SUMMARY OF THE INVENTION

The present invention has been made to solve the above-mentioned problems, and has as its object to provide an alignment apparatus capable of increasing the alignment precision of an object to be position-controlled, an exposure apparatus having the alignment apparatus, and a device manufacturing method.

According to the present invention, the foregoing object is attained by providing an alignment apparatus comprising a measuring instrument which measures a position of an object to be position-controlled, and a processor which performs a plurality of types of operations on the basis of a position signal obtained from the measuring instrument and outputs an operation result as a control signal that pertains to position control of the object to be position controlled, wherein the alignment apparatus performs a difference operation which calculates a difference signal of the position signal at a first sampling frequency and performs the operations other than the difference operation at a second sampling frequency lower than the first sampling frequency.

In a preferred embodiment, the first sampling frequency is an integral multiple of the second sampling frequency, and sampling periods of the sampling frequencies are in synchronism with each other.

In a preferred embodiment, the processor comprises:

a first processing region having a difference operation unit which performs the difference operation at the first sampling frequency; and a second processing region which performs the operations other than the difference operation at the second sampling frequency.

In a preferred embodiment, the apparatus further comprises:

first A/D conversion means, connected between the first processing region and the measuring instrument, for A/D-converting the position signal at the first sampling frequency; and second A/D conversion means, connected between the second processing region and the measuring instrument, for A/D-converting the position signal at the second sampling frequency.

In a preferred embodiment, the apparatus further comprises A/D conversion means, connected between the first processing region and the measuring instrument, for A/D-converting the position signal at the first sampling frequency, and the second processing region comprises first D/D conversion means for D/D-converting at the second sampling frequency the difference signal of the position signal calculated by the difference operation unit within the first processing region; and second D/D conversion means for D/D-converting at the second sampling frequency a position signal converted by the A/D conversion means.

In a preferred embodiment, the processor comprises physically different first and second processors, the first processor having a difference operation unit which performs the difference operation at the first sampling frequency, and the second processor performing the operations other than the difference operation at the second sampling frequency.

In a preferred embodiment, the measuring instrument comprises calculation means for calculating the difference signal of the measured position signal of the object to be position-controlled.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 shows graphs of the frequency characteristics of a difference operation at sampling frequencies of 10 kHz and 40 MHz;

FIG. 13 shows graphs of the frequency characteristics of a PID compensator at sampling frequencies of 10 kHz and 40 MHz.

DETAILED DESCRIPTION OF THE PREFERRED EMBODIMENTS

Preferred embodiments of the present invention will be described in detail in accordance with the accompanying drawings.

The present invention performs a difference operation for an error signal at a position where a delay time occurs at a higher frequency than that for control operations other than the difference operation, particularly, in an alignment apparatus that pertains to alignment control of a stage for an exposure apparatus. This increases a phase margin in the alignment apparatus with an alignment compensator (PID compensator) and then realizes an increase in alignment performance.

Figure 1:
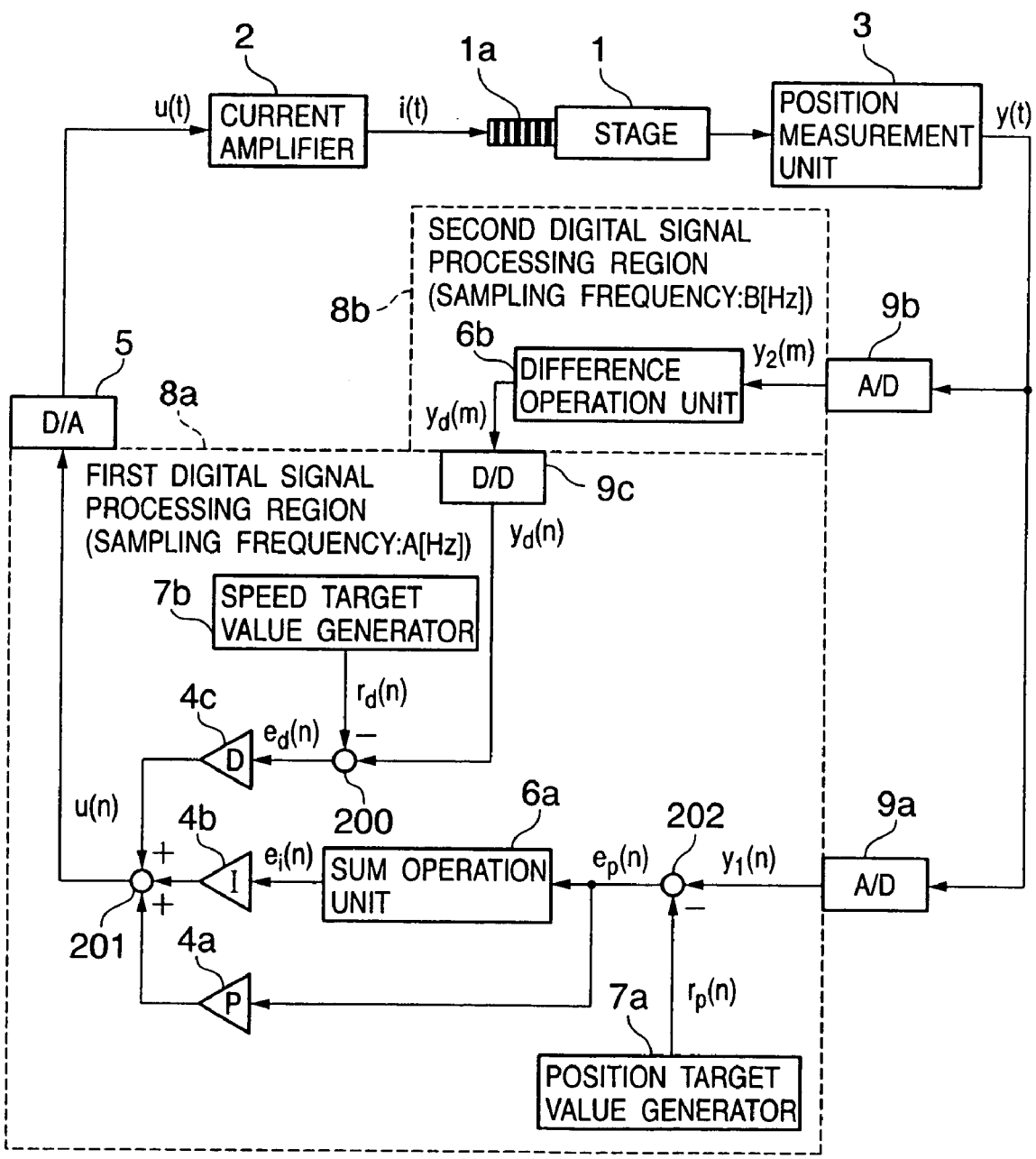
FIG. 1 is a diagram showing the arrangement of an alignment apparatus of an exposure apparatus according to the present invention.

FIG. 1 is a diagram showing the arrangement of an alignment apparatus of an exposure apparatus according to the present invention.

Figure 11:
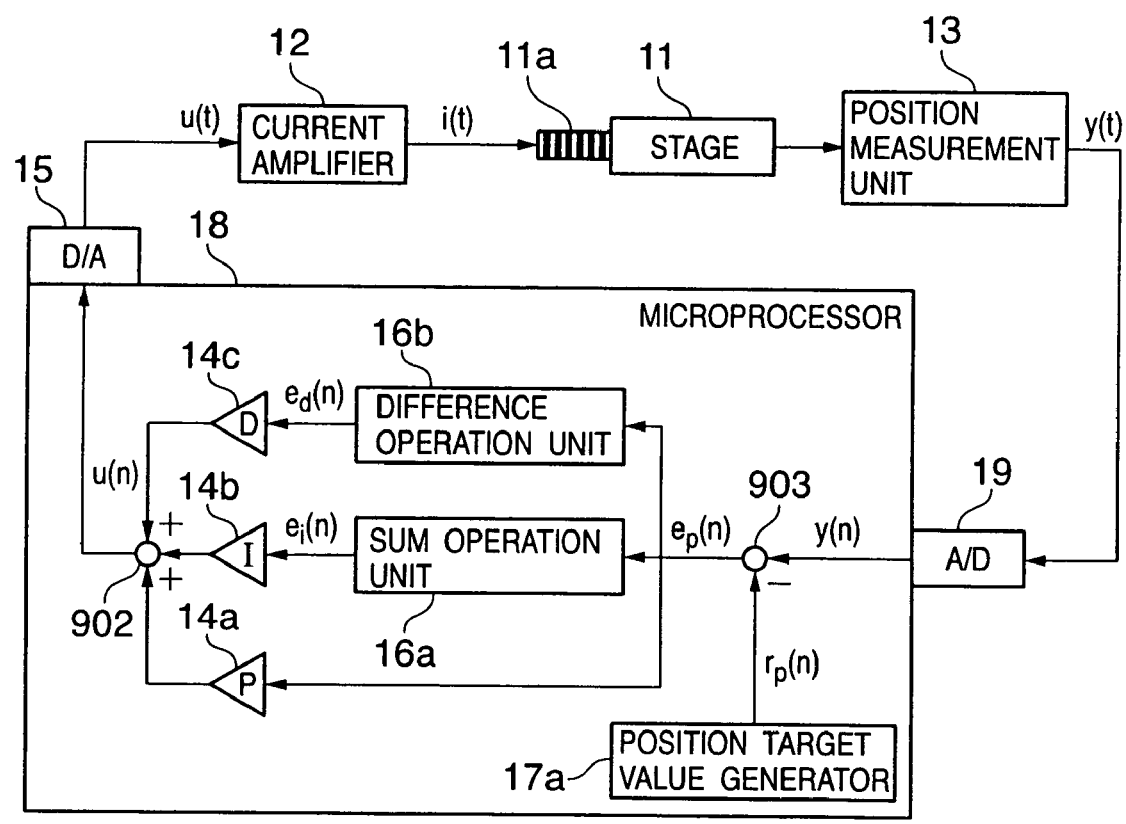
FIG. 11 is a diagram for explaining the control system of a conventional exposure apparatus.
Figure 14:
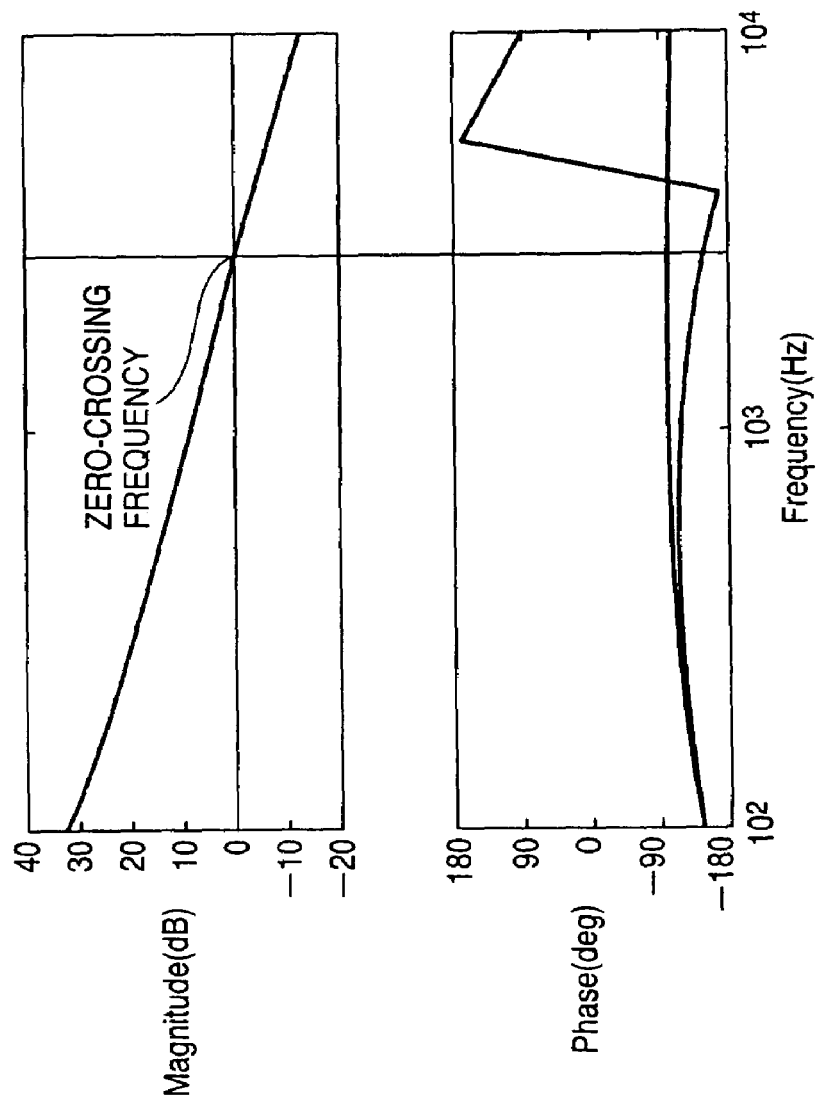
FIG. 14 shows graphs of the frequency characteristics of the open-loop transfer function in an alignment compensator at sampling frequencies of 10 kHz and 40 MHz.

Note that reference numerals 1 to 3, 1a, 4a to 4c, 5, 6a, 6b, and 7a in FIG. 1 correspond to reference numerals 11 to 13, 11a, 14a to 14c, 15, 16a, 16b, and 17a, respectively, in FIG. 11. Reference numerals 200 to 202 in FIG. 1 denote adders.

First and second A/D converters 9a and 9b convert a position signal y(t) of the stage 1 measured by the position measurement unit 3 to digital signals $y_1(n)$ and $y_2(m)$ at sampling frequencies A [Hz] and B [Hz], respectively. First and second digital signal processing regions 8a and 8b receive the digital signals.

Reference symbol t denotes time; n, the sample number at the sampling frequency A; and m, the sample number at the sampling frequency B. That is, the position signal y(t) is a position signal at time t. A digital signal y(n) is a digital signal whose sample number is n, and a digital signal y(m) is a digital signal whose sample number is m.

In the second digital signal processing region 8b, the difference operation unit 6b performs a difference operation for the position signal $y_2(m)$ at the sampling frequency B [Hz]. In the first digital signal processing region 8a, a control operation (e.g., a sum operation by the sum operation unit 6a, a gain operation, or the like) other than a difference operation is performed at the sampling frequency A [Hz]. To perform a difference operation at a sampling frequency higher than those for control operations other than a difference operation, the sampling frequency B is made sufficiently higher than the sampling frequency A. For example, the sampling frequency A is set at 10 kHz while the sampling frequency B is set at 40 MHz.

If the sampling frequency B cannot be made sufficiently higher than the sampling frequency A, the sampling frequency B needs to be an integral multiple of the sampling frequency A, and their sampling frequencies should not be shifted from each other (i.e., they need to be in synchronism with each other).

The relationship between the sampling period of the sampling frequency and the difference signal will be described with reference to FIGS. 2 to 4.

Figure 2:
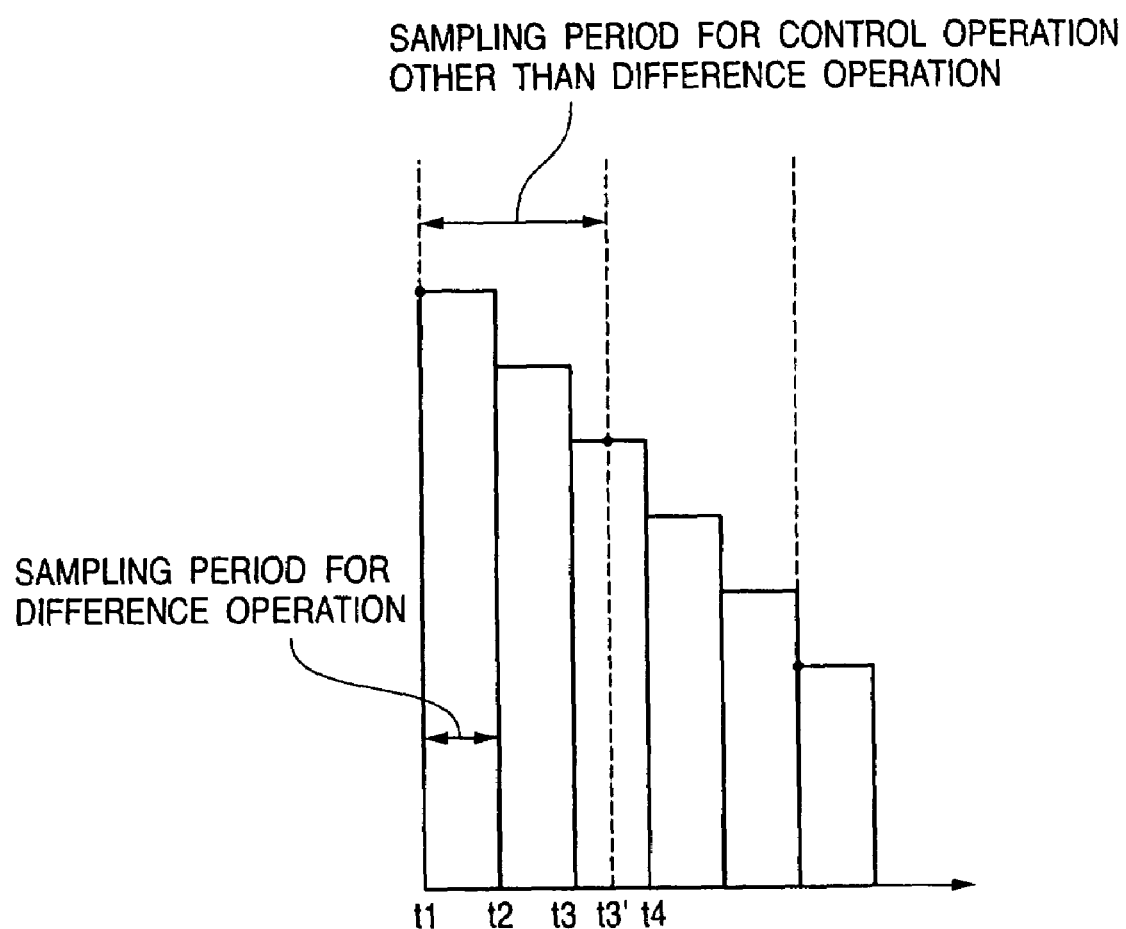
FIG. 2 is a chart showing a difference signal when a sampling frequency B or a difference operation is not an integral multiple of a sampling frequency A for control operations other than difference operation.
Figure 3:
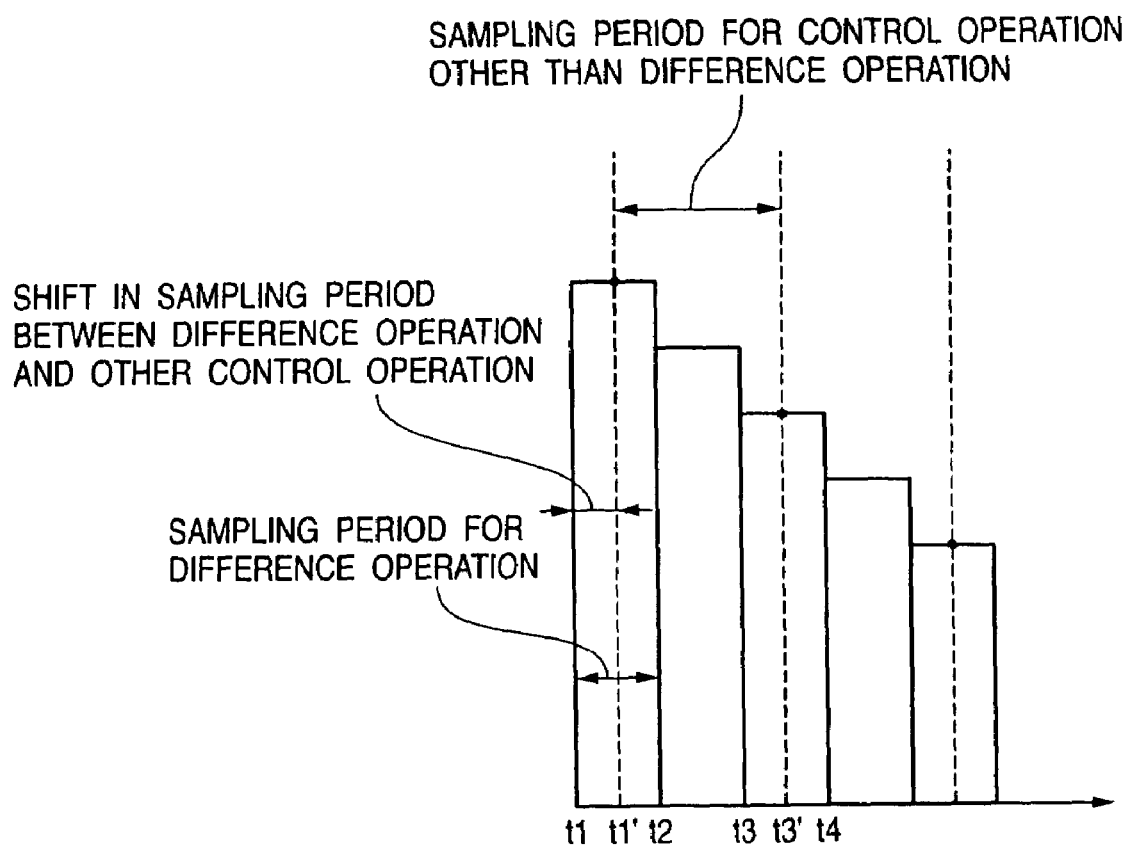
FIG. 3 is a chart showing the difference signal when the sampling frequency B for a difference operation is an integral multiple of the sampling frequency A for control operations other than difference operation, and their sampling periods are shifted from each other.
Figure 4:
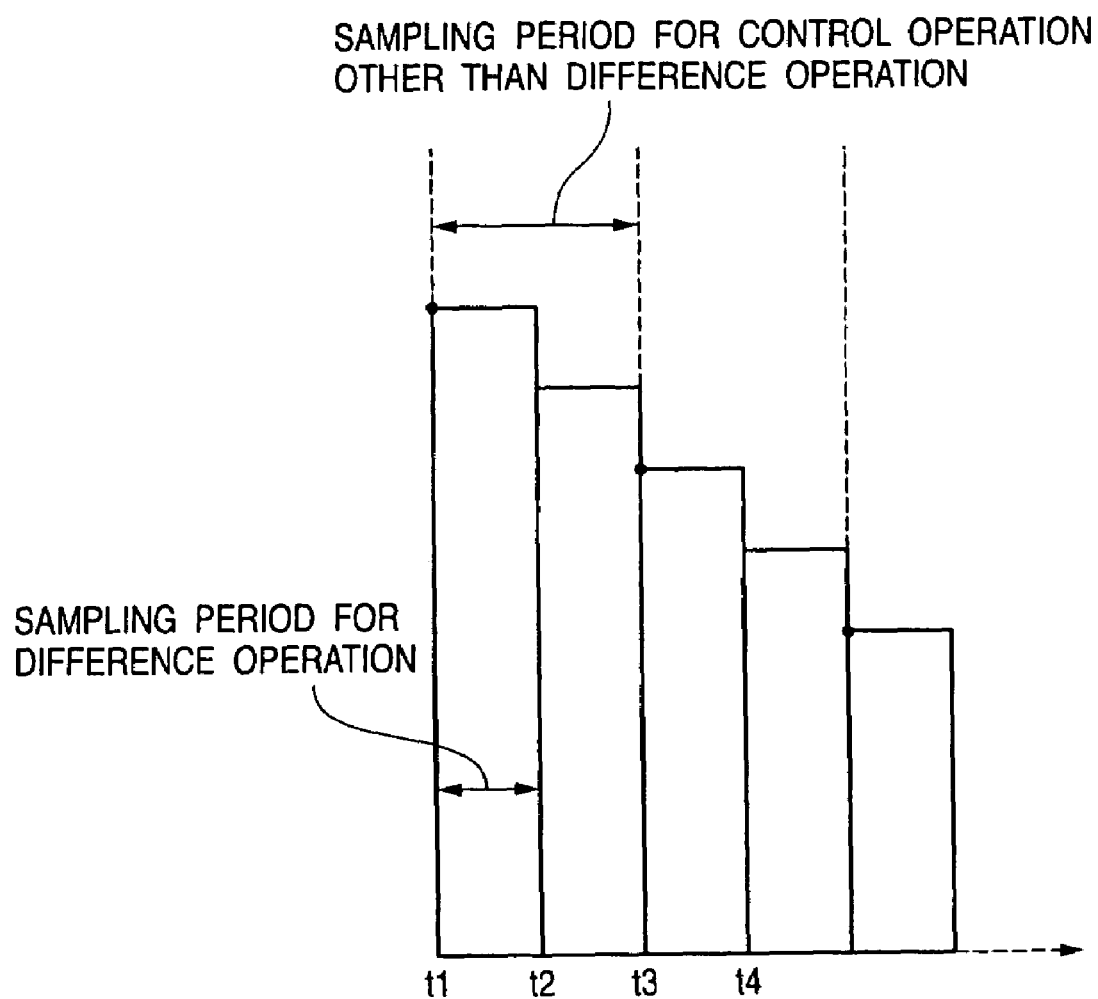
FIG. 4 is a chart showing the difference signal when the sampling frequency B for a difference operation is an integral multiple of the sampling frequency A for control operations other than difference operation, and their sampling periods are not shifted from each other.

Note that each of FIGS. 2 to 4 shows the relationship between the sampling period and the difference signal when the sampling frequency B is not sufficiently higher than the sampling frequency A.

FIG. 2 is a chart showing the difference signal when the sampling frequency B for a difference operation is not an integral multiple of the sampling frequency A for control operations other than a difference operation.

FIG. 3 is a chart showing the difference signal when the sampling frequency B for a difference operation is an integral multiple of the sampling frequency A for control operations other than a difference operation, and their sampling periods are shifted from each other.

FIG. 4 is a chart showing the difference signal when the sampling frequency B is an integral multiple of the sampling frequency for control operations other than a difference operation, and their sampling periods are not shifted from each other.

In FIGS. 2 to 4, the abscissa represents time ti (i=1, 2, . . . , N), while the ordinate represents the signal magnitude. Solid lines are used to represent difference signals, and dotted lines are used to represent the sampling period for control operations other than a difference operation. Each symbol • represents the value of a difference signal to be received when performing a control operation other than a difference operation.

In FIG. 2, the sampling frequency B for a difference operation is not an integral multiple of the sampling frequency A for control operations other than a difference operation. For this reason, difference signals may be held at times t1, t2, t3, and t4 and may be received at times t1' and t3'. In this case, the signal received at time t3' has a value held from time t3 and suffers a delay. This delay is undesirable.

In FIG. 3, the difference signal sampling frequency B is an integral multiple of the sampling frequency A for control operations other than a difference operation, and their sampling periods are shifted from each other. For this reason, difference signals may be held at times t1, t2, t3, and t4 and may be received at times t1' and t3'. In this case, the signal received at time t1' and t3' has a value held from time t1 to t3 and suffers a delay. This delay is undesirable.

In FIG. 4, the difference signal sampling frequency B is an integral multiple of the sampling frequency A for control operations other than a difference operation, and their sampling periods are not shifted from each other. In this case, the difference signal is held and at the same time is received as an operation target. Thus, the difference signal does not suffer a delay.

If the sampling frequency B is not sufficiently higher than the sampling frequency A, desirably, the sampling frequency B is an integral multiple of the sampling frequency A, and the their sampling periods are not shifted from each other. On the other hand, if the sampling frequency B is sufficiently higher than the sampling frequency A, any shift between the sampling periods produces little effect.

The PID compensator having the above-mentioned arrangement uses a high sampling frequency only for a difference operation. With this PID compensator, an inexpensive circuit with low processing power can output a high-precision control signal, unlike a conventional method in which all processes are performed at a high sampling frequency. In other words, when the PID compensator is used as an alignment compensator for the stage of the exposure apparatus, high-precision alignment can be realized.

A case will be described with reference to FIG. 5 wherein the PID compensator of FIG. 1 is used as the alignment apparatus for the stage of the exposure apparatus.

Note that the exposure apparatus comprises a light source such as an $F_2$ excimer laser which emits a short-wavelength laser beam as illumination light and uniformly illuminates a reticle (mask) through a proper illumination optical member. Light (exposure light) having passed through the reticle reaches, through various optical members, which constitute a projection optical system, the surface of a wafer mounted on a wafer stage. The light forms the pattern of the reticle on the wafer.

The wafer stage having the wafer mounted thereon is so arranged as to move three-dimensionally (in the X, Y, and Z directions). The pattern of the reticle is sequentially projected and transferred onto the wafer by repeating stepping and exposure, i.e., a so-called step and repeat method. When the present invention is applied to a scanning exposure apparatus, the exposure apparatus has almost the same arrangement.

A microprocessor in a main controller performs movement control, position control, and the like, for the stage having the wafer and reticle mounted thereon. These control operations are performed systematically, together with various operations such as wafer replacement, alignment operation, exposure operation, and the like.

First Embodiment

Figure 5:
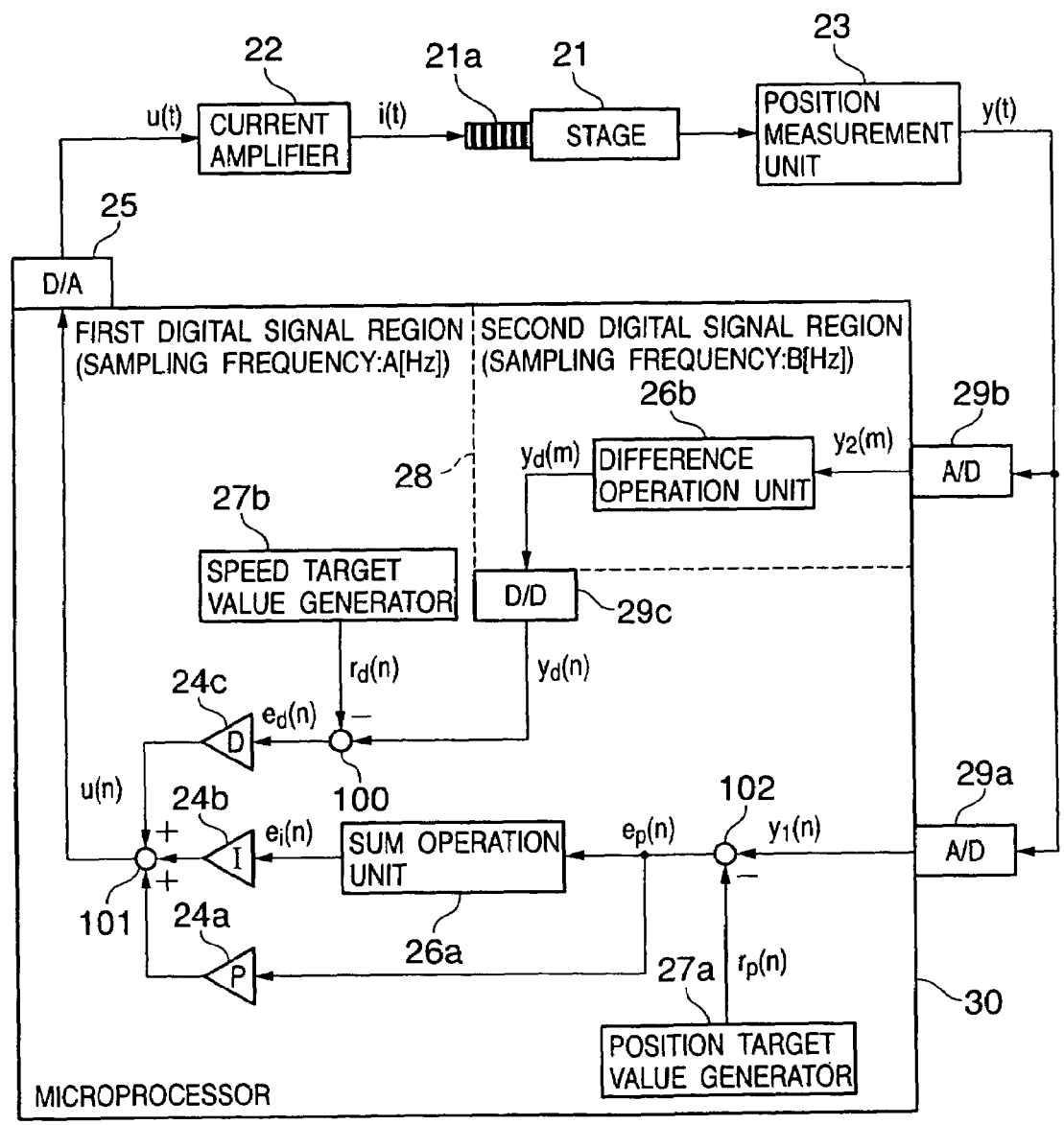
FIG. 5 is a diagram showing the arrangement of an alignment apparatus for an exposure apparatus according to the first embodiment of the present invention.

FIG. 5 is a diagram showing the arrangement of an alignment apparatus for an exposure apparatus according to the first embodiment of the present invention.

First and second A/D converters 29a and 29b convert a stage position signal y(t) measured by a position measurement unit 23 to digital signals $y_1(n)$ and $y_2(m)$ at sampling frequencies A [Hz] and B [Hz], respectively. A microprocessor 30 receives the digital signals.

In the microprocessor 30, two processes are in action at the sampling frequencies A [Hz] and B [Hz], respectively. To perform a difference operation by a different operation unit 26b at a higher sampling frequency than that for other control operations (e.g., a sum operation by a sum operation unit 26a), the sampling frequencies are so set as to satisfy (sampling frequency B for a difference operation)>(sampling frequency A for other control operations).

When the sampling frequency B is not sufficiently higher than the sampling frequency A, desirably, the sampling frequency B is an integral multiple of the sampling frequency A, and their sampling periods are not shifted from each other.

In a digital signal processing region 28 for the sampling frequency B [Hz], the digital signal $y_2(m)$ is converted by the difference operation unit 26b to a difference signal $y_d(m)$ and is passed to a first digital signal processing region for the sampling frequency A [Hz].

In the first digital signal processing region for the sampling frequency A [Hz], the following processes are performed.

1. An adder 102 calculates an error signal $e_p(n)$ which is a difference between the digital signal $y_1(n)$ and a position target value generated by a position target value generator 27a.

2. The sum operation unit 26a calculates an error sum signal $e_i(n)$ of the error signal $e_p(n)$.

3. A D/D converter 29c converts the difference signal $y_d(m)$, which is calculated in the processing region 28 for the sampling frequency B [Hz], to a difference signal $y_d(n)$ for the sampling frequency A [Hz].

4. An adder 100 calculates an error difference signal $e_d(n)$, which is a difference between the digital signal $y_d(n)$ and a speed target value $r_d(n)$ generated by a speed target value generator 27b.

5. The product of the error signal $e_p(n)$ and a proportional gain 24a(P), the product of the error sum signal $e_i(n)$ and an integral gain 24b(I), and the product of the error difference signal $e_d(n)$ and a derivative gain 24c(D) are calculated. An adder 101 calculates the sum of the products as a control signal u(n).

In short, the control signal u(n) (=$Pe_p(n)+Ie_i(n)+De_d(n)$) is calculated.

The control signal u(n) thus calculated is converted by a D/A converter 25 to a control signal u(t) and is amplified by a current amplifier 22. With the control signal, a linear motor 21a drives (aligns) a stage 21.

The speed target value generator 27b will be described now.

The present invention performs digital conversion of position signals and a difference operation at the higher sampling frequency B and, thus, cannot perform a difference operation for a position error signal, unlike a conventional method. For this reason, the speed target value generator 27b, a position target value $r_p(n)$, generated by the position target value generator 27a, is used. The position error difference signal $e_d(n)$ is calculated by subtracting the speed target value $r_d(n)$ from the position difference signal $y_d(n)$.

Figure 6:
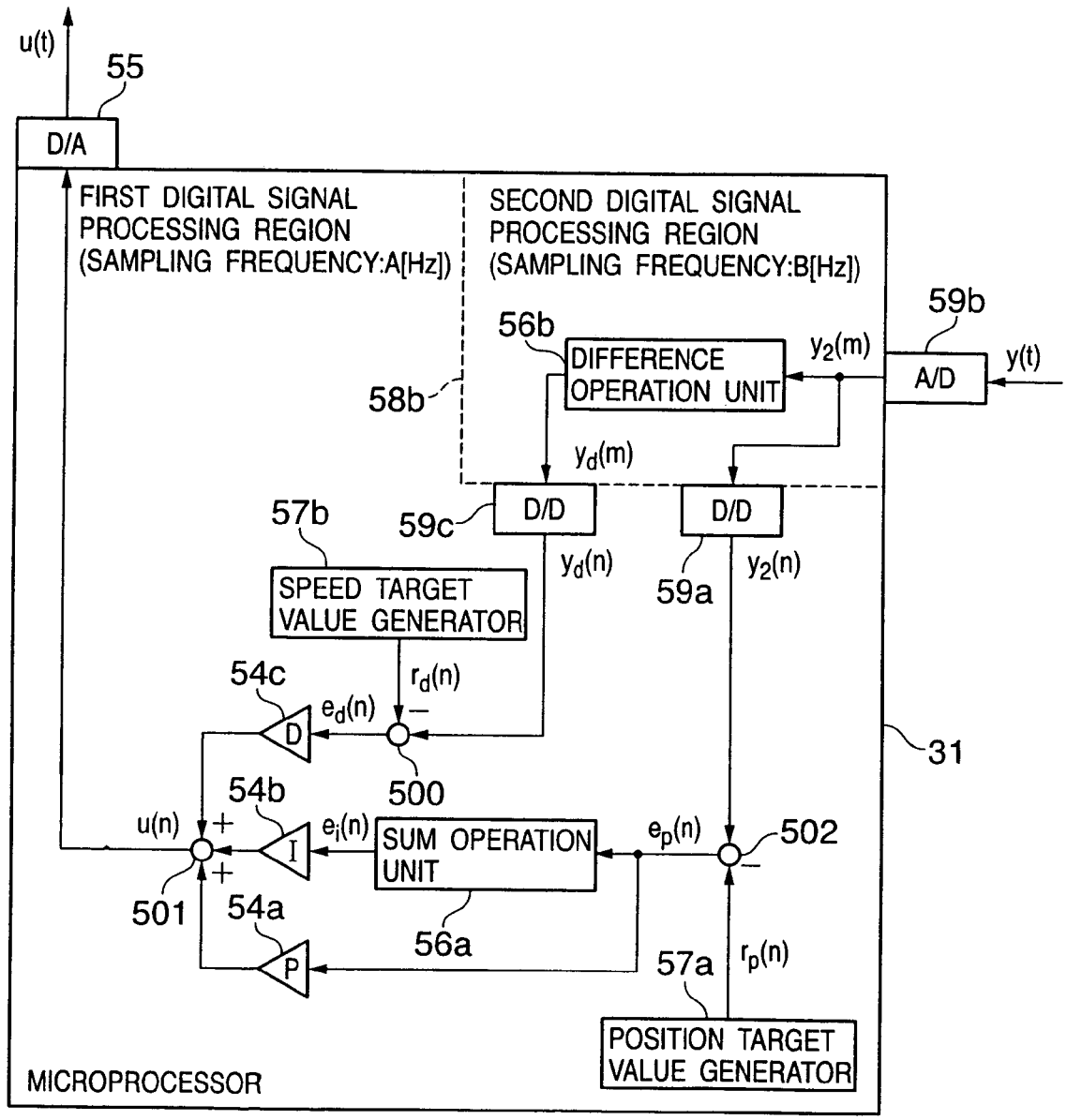
FIG. 6 is a diagram showing a modification of the arrangement of the alignment apparatus for the exposure apparatus according to the first embodiment of the present invention.

The arrangement of FIG. 6, which is a modification of the arrangement of FIG. 5, can produce the same effect as that of FIG. 5.

FIG. 6 is a diagram showing a modification of the arrangement of the alignment apparatus for the exposure apparatus according to the first embodiment of the present invention.

The arrangement of FIG. 6 is different from that of FIG. 5 in A/D and D/D converters.

More specifically, the arrangement of FIG. 6 has one A/D converter 59b and two D/D converters, i.e., first and second D/D converters 59a and 59c.

The A/D converter 59b converts the stage position signal y(t) to the digital signal $y_2(m)$ at the sampling frequency A [Hz]. At the same time, a difference operation unit 56b performs a difference operation for the position signal y(t) at the sampling frequency B [Hz]. With this operation, the difference signal $y_d(m)$ is calculated.

Then, the first and second D/D converters 59a and 59c are used to convert the digital signal $y_2(m)$ and difference signal $y_d(m)$, respectively, at the sampling frequency A [Hz], thereby obtaining a digital signal $y_2(n)$ and the difference signal $y_d(n)$. The subsequent control operation is performed in the same manner as that described for the arrangement of FIG. 5. Reference numerals for components in FIG. 6 are different from those in FIG. 5.

More specifically, reference numerals 54a to 54c, 55, 56a, 56b, 57a, 57b, and 500 to 502 in FIG. 6 correspond to reference numerals 24a to 24c, 25, 26a, 26b, 27a, 27b, and 100 to 102 in FIG. 5.

Figure 7:
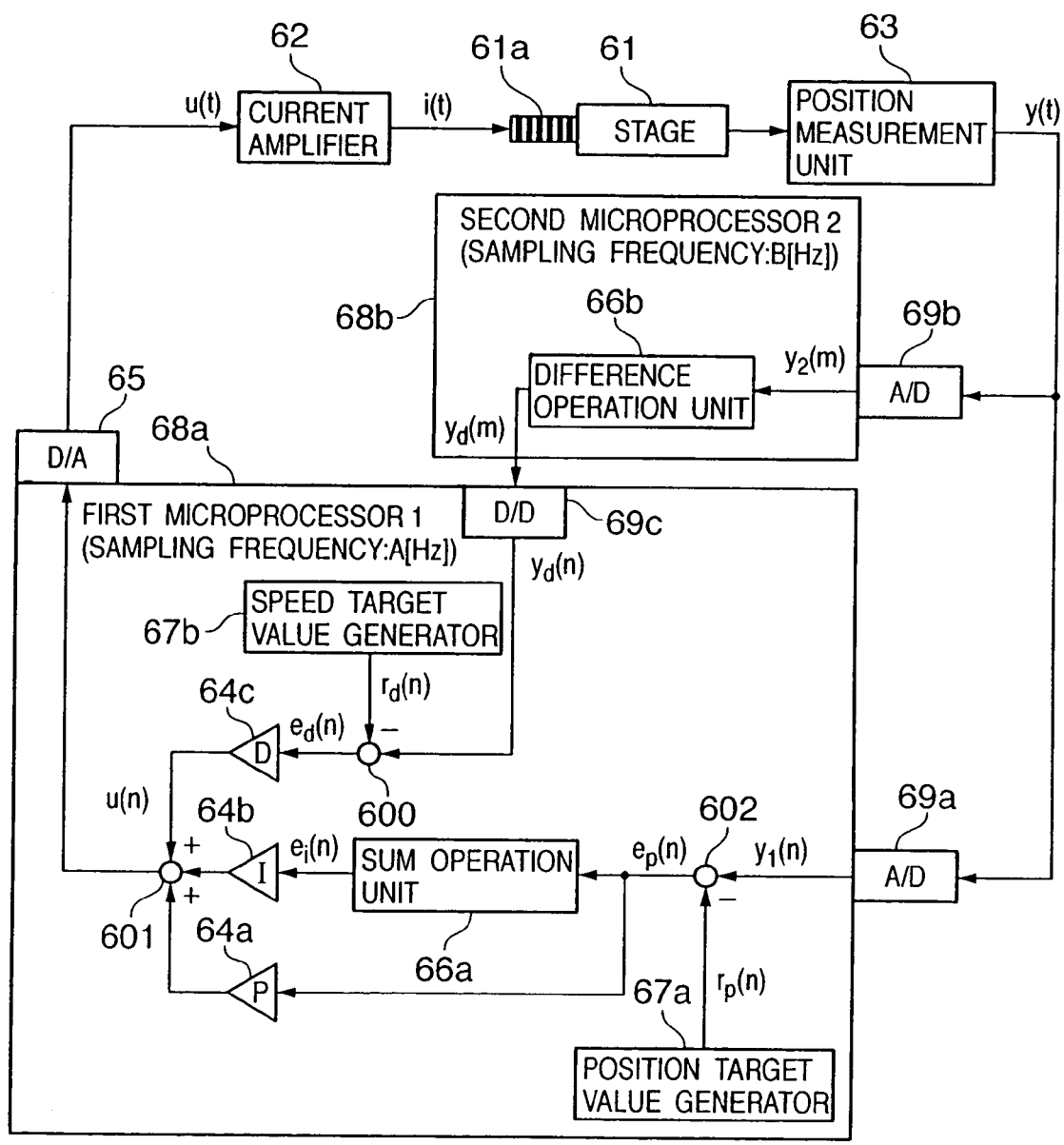
FIG. 7 is a diagram showing another modification of the arrangement of the alignment apparatus for the exposure apparatus according to the first embodiment of the present invention.

The arrangement of FIG. 7, which is another modification of the arrangement of FIG. 5, can produce the same effect as that of FIG. 5.

FIG. 7 is a diagram showing a modification of the arrangement of the alignment apparatus for the exposure apparatus according to the first embodiment of the present invention.

In the arrangement of FIG. 7, processes, which are performed by the second digital signal processing region 28 for the sampling frequency B and the first digital signal processing region for the sampling frequency A in the arrangement of FIG. 5, are implemented by separate microprocessors. More specifically, two microprocessors 68a and 68b are provided. A difference operation, which is performed by the second digital signal processing region 28 for the sampling frequency B in FIG. 5, is implemented by the microprocessor 68b, while a process, which is performed by the first digital signal processing region for the sampling frequency A in FIG. 5, is implemented by the microprocessor 68a.

Reference numerals 61 to 63, 61a, 64a to 64c, 65, 66a, 66b, 67a, 67b, 69a, 69b, and 600 to 602 in FIG. 7 correspond to reference numerals 21 to 23, 21a, 24a to 24c, 25, 26a, 26b, 27a, 27b, 29a, 29b, and 200 to 202, respectively, in FIG. 5.

As described above, according to the first embodiment, only a difference operation, which requires a high sampling frequency, is performed at a higher sampling frequency than the sampling frequency for control operations other than a difference operation. This makes the processing load on the microprocessor lighter and the delay time caused by a difference operation shorter, than an arrangement wherein all processes within the microprocessor are performed at a high sampling frequency to increase the precision. With this arrangement, an inexpensive alignment apparatus with high precision can be implemented.

Second Embodiment

In the first embodiment, a position difference signal or position error difference signal is calculated in the microprocessor. When the position measurement unit is arranged to input the position difference signal for the stage to the microprocessor, the microprocessor may be arranged to calculate only the position error difference signal using the position difference signal.

A stage for a semiconductor exposure apparatus requires an alignment precision on the order of nanometers, and its position is generally measured using a laser interferometer. A microprocessor calculates a position error difference signal using a position difference signal output from the laser interferometer.

A measurement board of a laser interferometer (ZMI 2004) manufactured by Zygo can output a position signal or position difference signal as a digital signal at a sampling frequency of 40 MHz.

Figure 8:
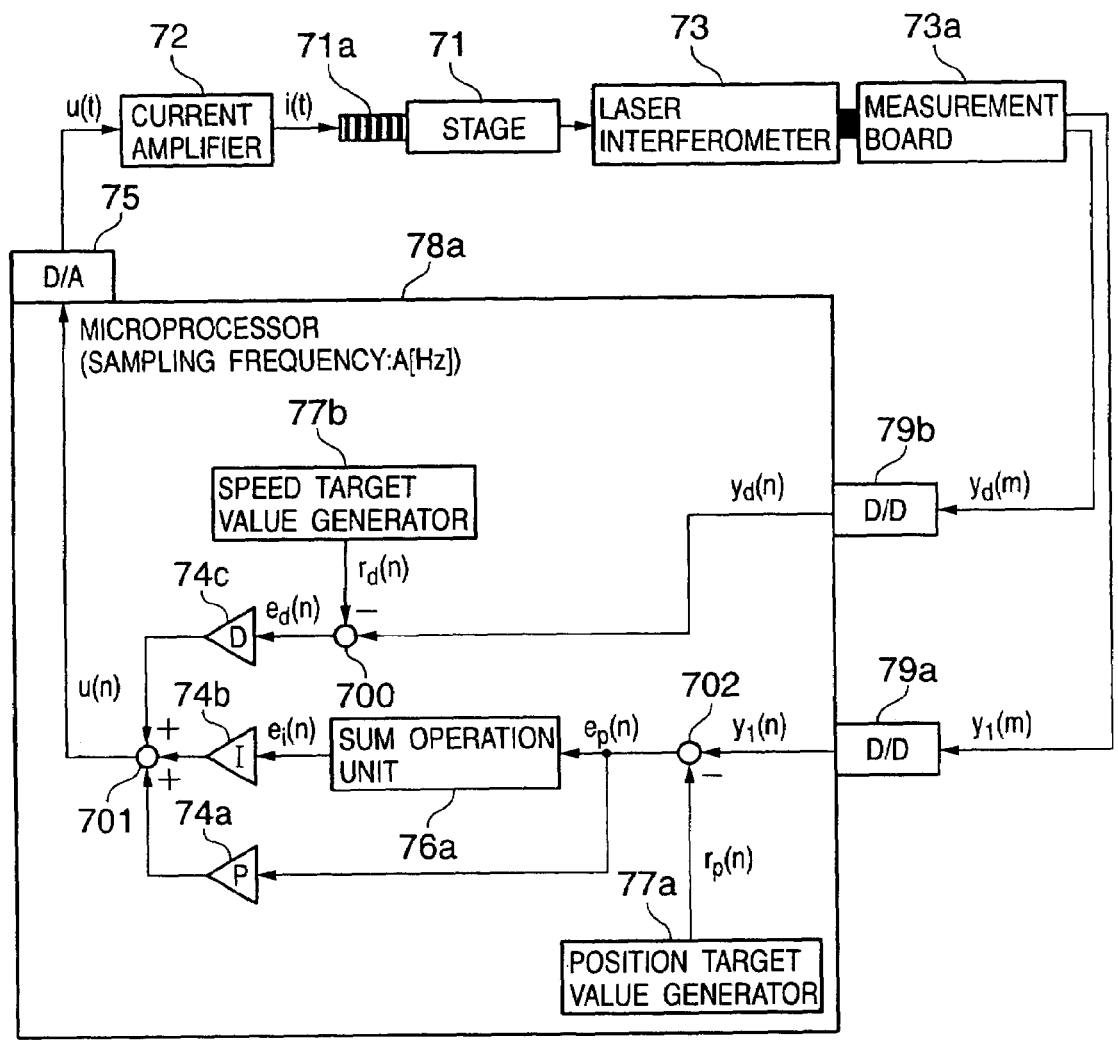
FIG. 8 is a diagram showing the arrangement of an alignment compensator of an exposure apparatus according to the second embodiment of the present invention.

The second embodiment will describe the arrangement of an alignment apparatus in an exposure apparatus having such a laser interferometer and measurement board as a position measurement unit with reference to FIG. 8.

FIG. 8 is a diagram showing the arrangement of an alignment apparatus for an exposure apparatus according to the second embodiment of the present invention.

Note that reference numerals 71, 71a, 72, 74a to 74c, 75, 76a, 77a, 77b, and 700 to 702 in FIG. 8 correspond to reference numerals 21, 21a, 22, 24a to 24c, 25, 26a, 27a, 27b, and 200 to 202 in FIG. 5.

In FIG. 8, the position of the stage 71 is measured by a laser interferometer 73. A measurement board 73a of the laser interferometer 73 can output a position signal $y_d(m)$ at a sampling frequency of 40 MHz and a position difference signal $y_d(m)$ having undergone a difference operation at the sampling frequency of 40 MHz. The position signal $y_1(m)$ and position difference signal $y_d(m)$ are input to a microprocessor 78a.

The position signal $y_1(m)$ and position difference signal $y_d(m)$, having been processed at the sampling frequency of 40 MHz, are converted by first and second D/D converters 79a and 79b to a position signal $y_1(n)$ and a position difference signal $y_d(n)$ for the sampling frequency A [Hz] of the microprocessor 78a. The signals are received by the microprocessor 78a.

By performing the same control operation as described in the first embodiment, the stage 71 can be aligned at high precision.

Since the sampling frequency for the microprocessor 78a is several tens of kHz, the position difference signal $y_d(m)$ output by the measurement board 73a of the laser interferometer 73 is a signal processed at a sampling frequency (40 MHz) sufficiently higher than the sampling frequency for the microprocessor 78a.

The arrangement in which a position difference signal output from the measurement board 73a of the laser interferometer 73 is used suffers shorter delay in the position difference signal than an arrangement as described in the first embodiment, in which a difference operation is performed in a microprocessor. The phase margin of the control system increases. Therefore, the position precision can be increased without an expensive microprocessor.

As described above, according to the second embodiment, alignment of an exposure apparatus stage can be performed at a higher precision, in addition to the effects described in the first embodiment.

[Application Example of an Exposure Apparatus]

The manufacturing process of a semiconductor device using each of the above-mentioned exposure apparatuses will be described next.

Figure 9:
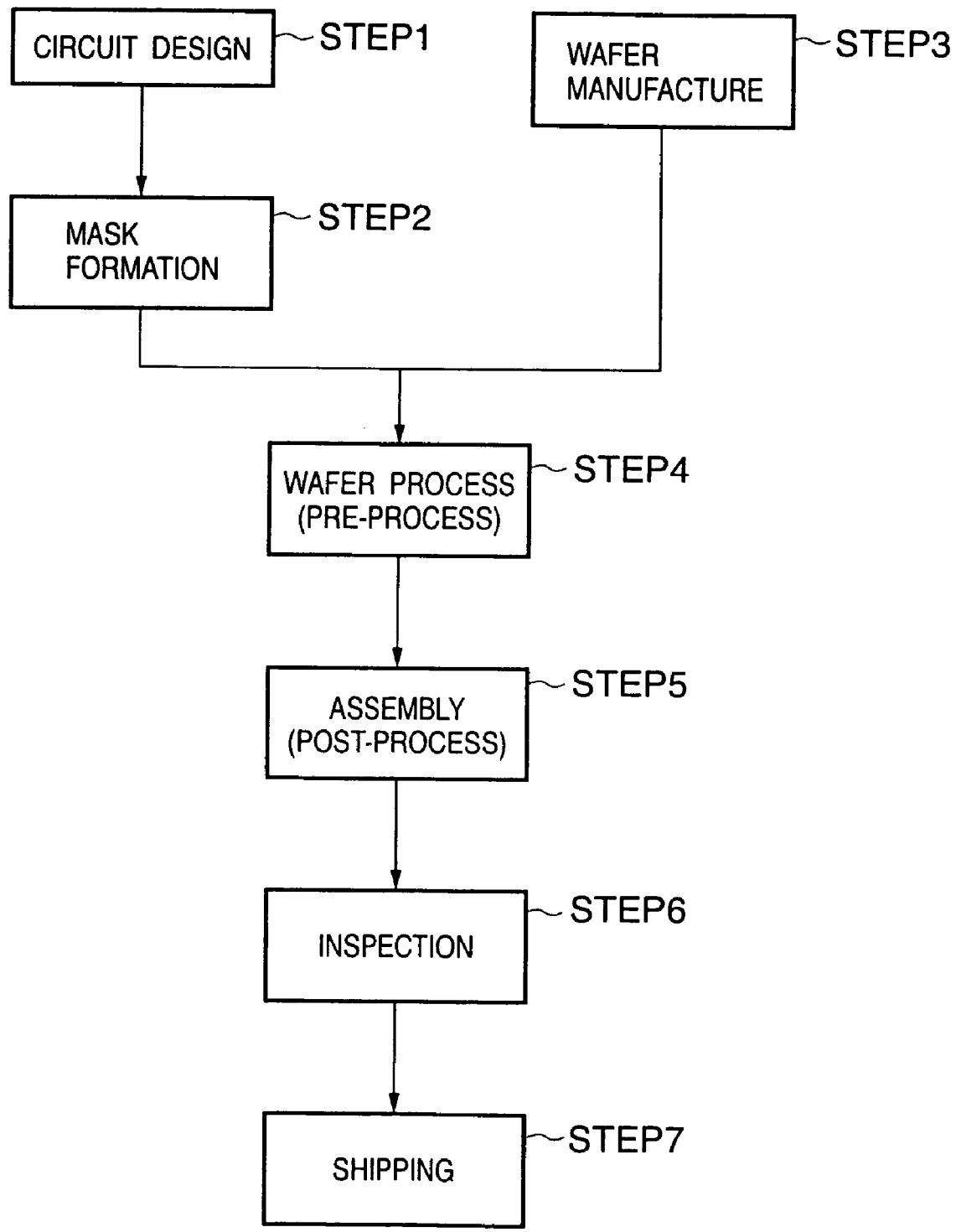
FIG. 9 is a flowchart showing the flow of the whole manufacturing process of a semiconductor device.

FIG. 9 shows the flow of the whole manufacturing process of the semiconductor device.

In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a preprocess, an actual circuit is formed on the wafer by lithography using the prepared mask and wafer.

Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test of the semiconductor device manufactured in step 5. After these steps, the semiconductor device is completed and shipped (step 7).

Figure 10:
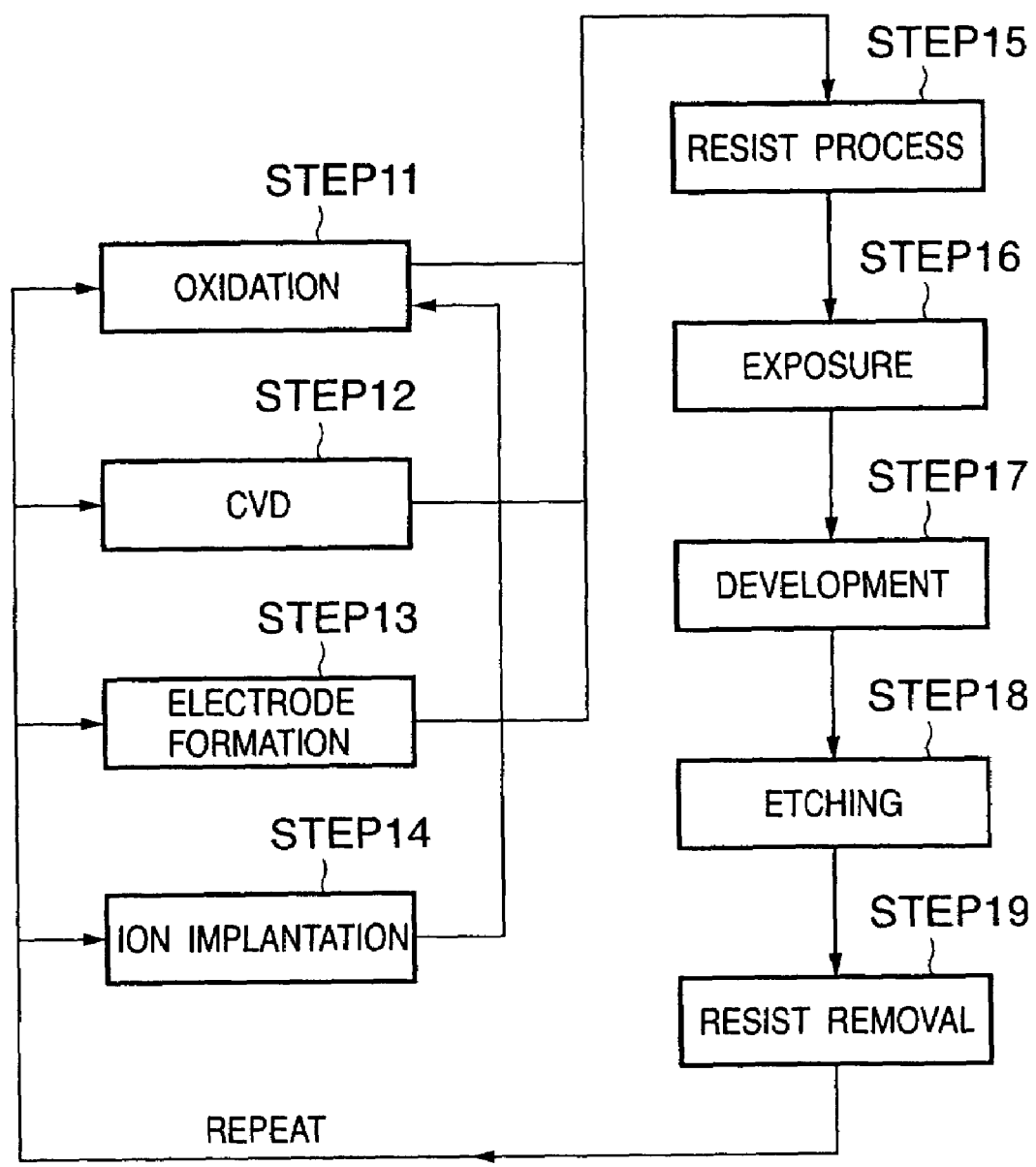
FIG. 10 is a flowchart showing the detailed flow of the wafer process.

FIG. 10 shows the detailed flow of the above-mentioned wafer process.

In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer using the above-mentioned exposure apparatuses. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

The PID compensator in each of the above-mentioned embodiments has been described by taking as an example a case wherein the PID compensator is used as the alignment compensator of a stage alignment apparatus for an exposure apparatus. The present invention is not limited to this. The present invention can be applied to a device such as a precision machine tool or precision measuring tool, which position-controls a moving member (object to be position-controlled), such as a stage.

The embodiments have been described. The present invention can constitute an embodiment as, e.g., a system, an apparatus, a method, a program, a storage medium, or the like. More specifically, the present invention can be applied to a system comprising a plurality of devices or an apparatus comprising a single device.

The present invention is not limited to the above embodiments and various changes and modifications can be made within the spirit and scope of the present invention. Therefore, to apprise the public of the scope of the present invention, the following claims are made.

What is claimed is:

1. An alignment apparatus comprising
   a measuring instrument which measures a position of an object to be position-controlled; and
   a processor which performs a plurality of types of operations on the basis of a position signal obtained from said measuring instrument and outputs an operation result as a control signal that pertains to position control of the object to be position-controlled,
   wherein the alignment apparatus performs a difference operation which calculates a difference signal of the position signal at a first sampling frequency and performs the operations other than the difference operation at a second sampling frequency lower than the first sampling frequency.

2. The apparatus according to claim 1, wherein the first sampling frequency is an integral multiple of the second sampling frequency, and sampling periods of the sample frequencies are in synchronism with each other.

3. The apparatus according to claim 1, wherein said processor comprises:
   a first processing region having a difference operation unit which performs the difference operation at the first sampling frequency and
   a second processing region which performs the operations other than the difference operation at the second sampling frequency.

4. The apparatus according to claim 3, further comprising:
   first A/D conversion means, connected between the first processing region and said measuring instrument, for A/D-converting the position signal at the first sampling frequency; and
   second A/D conversion means, connected between the second processing region and said measuring instrument, for A/D-converting the position signal at the second sampling frequency.

5. The apparatus according to claim 3, wherein
   the apparatus further comprises A/D conversion means, connected between the first processing region and said measuring instrument, for A/D-converting the position signal at the first sampling frequency, and
   the second processing region comprises:
   first D/D conversion means for D/D-converting at the second sampling frequency the difference signal of the position signal calculated by the difference operation unit within the first processing region; and
   second D/D conversion means for D/D-converting at the second sampling frequency a position signal converted by said A/D conversion means.

6. The apparatus according to claim 1, wherein
   said processor comprises physically different first and second processors,
   the first processor having a difference operation unit which performs the difference operation at the first sampling frequency, and
   the second processor performing the operations other than the difference operation at the second sampling frequency.

7. The apparatus according to claim 1, wherein
   said measuring instrument comprises calculation means for calculating the difference signal of the measured position signal of the object to be position-controlled.

8. An exposure apparatus which controls a position of a stage using an alignment apparatus as defined in claim 1.

* * * * *

UNITED STATES PATENT AND TRADEMARK OFFICE
CERTIFICATE OF CORRECTION

PATENT NO. : 7,145,638 B2 Page 1 of 1
APPLICATION NO. : 10/941922
DATED : December 5, 2006
INVENTOR(S) : Hiroshi Isobe It is certified that error appears in the above-identified patent and that said Letters Patent is hereby corrected as shown below:

COLUMN 1:
Line 8, "No. 2003 330402" should erad -- No. 2003-330402 --.

COLUMN 4:
Line 48, "comprises" should read -- comprises: --.

COLUMN 7:
Line 36, "the" should be deleted.

COLUMN 10:
Line 45, "signal $y_d(m)$" should read -- signal $y_1(m)$ --.

COLUMN 12:
Line 2, "comprising" should read -- comprising: --.
Line 18, "sample" should read -- sampling --.
Line 24, "frequency" should read -- frequency; --.

Signed and Sealed this

Twenty-fourth Day of April, 2007

JON W. DUDAS
*Director of the United States Patent and Trademark Office*